United States Patent [19]
Babcock et al.

[11] Patent Number: 5,514,276
[45] Date of Patent: May 7, 1996

[54] PERMSELECTIVE HOLLOW FIBER FLUID SEPARATION MEMBRANES HAVING PLASMA-POLYMERIZED LUMEN-SIDE COATINGS

[75] Inventors: Walter C. Babcock; Geoffrey D. Hyde; Bruce M. Johnson; George W. Rayfeld, all of Bend, Oreg.

[73] Assignee: Bend Research, Inc., Bend, Oreg.

[21] Appl. No.: 264,172

[22] Filed: Jun. 21, 1994

Related U.S. Application Data

[63] Continuation of Ser. No. 49,344, Apr. 21, 1993, abandoned.
[51] Int. Cl.⁶ ..................................................... B01D 69/08
[52] U.S. Cl. ........................................ 210/490; 210/500.23
[58] Field of Search ................................ 201/490, 500.23; 96/10, 11, 12, 13

[56] References Cited

U.S. PATENT DOCUMENTS

| 4,948,628 | 8/1990 | Montgomery ............... 427/237 X |
| 5,002,590 | 3/1991 | Friesen et al. . | |

OTHER PUBLICATIONS

Matsuzawa et al., 38 Journal of Applied Polymer Science: Applied Polymer Symposium 65 (1984).

Primary Examiner—Frank Spear
Attorney, Agent, or Firm—Chernoff, Vilhauser, McClung & Stenzel

[57] ABSTRACT

Hollow fiber fluid separation membranes having a first lumen-side permselective coating and a second lumen-side plasma-polymerized coating are disclosed, as well as methods of making the same.

7 Claims, 2 Drawing Sheets

PERMSELECTIVE HOLLOW FIBER FLUID SEPARATION MEMBRANES HAVING PLASMA-POLYMERIZED LUMEN-SIDE COATINGS

This is a continuation of application Ser. No. 08/049,344 filed on 4/21/93, now abandoned.

Plasma-induced polymerization and surface modification is a relatively young technical discipline that has the capability of modifying surface properties and generating thin polymer-like films on substrates. Typical applications relate to the preparation of composite gas-permselective membranes by forming a permselective film on a polymeric substrate such as a flat sheet, a tube or a hollow fiber. See, for example, U.S. Pat. Nos. 4,410,338, 4,483,901, 4,533, 369, 4,696,686 and 4,824,444. None of these patents however disclose a process for coating the inside of very small ($\leq 2$ mm) diameter tubular substrates such as hollow fibers, which are very desirable in separation applications because of their ease of fabrication, their durability and the ability to achieve commercially useful surface areas in separation devices with them. An inside coating or modified lumen surface is generally desirable as it allows protection of the fairly fragile coating or modified surface while still leaving it accessible to contact with fluids, which is particularly desirable in vascular prosthesis applications. Hoffman et al., in ASTM Special Publication No. 898, pp. 137–155 (1986), disclose the preparation of a poly(tetrafluoroethylene) (PTFE) graft coating on the inside of Dacron® vascular prostheses comprising hollow fibers 4 to 5 mm inside diameter (ID). Matzuzawa et al., in 38 *J. Appl. Polym. Sci: Appl. Polym. Symp.* 65 (1984), disclose plasma polymerization coating of very thin layers (0.01–0.05 micron) of PTFE and poly(hexafluoroethane) on the inside of hollow silastic tubing having an ID of 3.3 mm at low monomer gas feed rates and pressures and low glow discharge radio frequency (RF) powers of 10 to 25 watts.

The general consensus in the art has been that it is impossible to coat or modify the lumen surface of very small diameter (<3.3 mm ID) hollow substrates by a plasma process because known apparatus and conditions have not been capable of sustaining a plasma within such small spaces. In the context of this invention, plasma is a body of partially ionized gas that comprises gas atoms and molecules in the ground state, electrons, and "excited species." "Excited species" may be broadly defined as ions of either polarity, gas atoms or molecules in higher forms of excitation, and light quanta. To generate and sustain a plasma that is useful for plasma-induced surface modification, or for preparing plasma polymer coatings, a suitable power source (such as an electrical discharge) is applied to a reactive species in the gas phase. Reactive species may be nonpolymerizable gases such as hydrogen, oxygen, or argon, or polymerizable monomer vapor such as methane, acetylene, or tetrafluoroethlyene. The power source causes the reactive species to ionize to form excited species and electrons. The electrons, which carry a negative charge, are accelerated under the influence of the power source. The power source may comprise any electromagnetic field wherein there is movement of charge carriers. Upon acceleration, the electrons collide with additional reactive species to form additional excited species and electrons. This collision process, mainly between electrons and ground state reactive species, sustains the plasma. Collision of excited-state nonpolymerizable gases with surfaces results in modification of the properties of the surfaces. Collision of excited-state polymerizable monomer vapor with surfaces results in growth of a plasma-induced polymer film on the surfaces.

Energy is lost from the plasma when electrons and excited state species collide with a surface. The plasma terminates when the rate of collision of excited species with surfaces (referred to herein as the rate of quenching) is sufficiently greater than the rate of generation of excited species. Because the rate of quenching of plasmas in the interior of a substrate is known to be directly proportional to the ratio of interior surface area to interior volume of the substrate, conventional wisdom in the art would predict that this rate of collision of excited species with the inside walls of small-diameter substrates would quickly exceed the rate of generation of excited species, leading to a rapid termination of the plasma.

There therefore still exists a need in the art of plasma-induced polymerization and surface modification for a process capable of forming and sustaining a plasma in the bores of very small diameter ($\leq 2$ mm) hollow substrates in order to modify the surface properties therein, or to form reasonably uniform coatings ranging from very thin (0.01 to 0.2 micron) to reasonably thick ($\geq 0.2$ micron). This need is met by the present invention, which is summarized and described in detail below.

SUMMARY OF THE INVENTION

There are essentially two aspects to the present invention. In a central aspect, the invention comprises a process for modifying or coating the inside or lumen surface of at least one elongate nonconductive hollow substrate having an inside diameter of 2 mm or less.

In a closely related aspect, the invention comprises the inside surface-modified or coated hollow substrate formed by the above process.

DETAILED DESCRIPTION OF THE INVENTION

Figure 1:
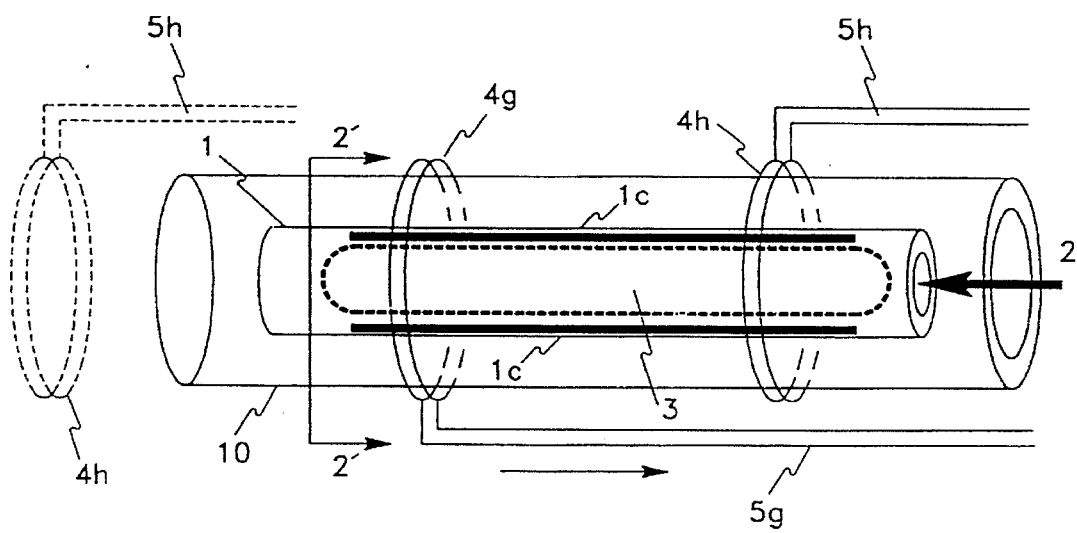
FIG. 1 is a schematic of an exemplary apparatus useful in conducting the process of the present invention.

According to the present invention there is provided a process for modifying or coating the lumen surface of very small diameter hollow substrates, as well as the product of such a process. When the process is conducted in a reactor, it has been found that the combination of (1) high monomer feed flow velocity, (2) high monomer pressure, (3) relatively high RF power density, and (4) a particular dimensional relationship between the reactor and the substrate, permits the plasma-induced polymerization coating or surface modification to be confined to the lumens of very small diameter ($\leq 2$ mm) hollow substrates. In the special case of coating or surface-modifying a substrate without the use of a reactor, the substrate must have sufficient strength to withstand the pressure difference between the external ambient pressure and the required low pressures and must be sufficiently impermeable to prevent the entry into the interior of an excessive amount of ambient (non-monomer feed) gases. More specifically, the permeability must be such that the rate of gas flow from the outside to the inside of the substrate through the wall is less than or equal to the volumetric flow rate of the gaseous reactive species through the inside of the substrate.

In the case of the process conducted in a reactor, the basic process comprises the steps of (a) providing a substantially tubular reactor having an inside diameter such that there is no empty elongate space in the reactor other than the space within the substrate capable of containing an axially positioned cylinder with an outside diameter greater than one-half the inside diameter of the hollow substrate;

(b) axially positioning the hollow substrate in the reactor so that the longitudinal axis of the hollow substrate is parallel to the longitudinal axis of the reactor;

(c) introducing a gaseous reactive species into the interior of the hollow substrate at a rate of from about 0.1 to about 50.0 sccm/min and at a pressure of from about 200 to about 5000 millitorr; and (d) generating and sustaining a plasma in the interior of the hollow substrate by subjecting the reactive species to a radio frequency discharge of from 10 to 500 watts to thereby modify or coat the interior surface of the hollow substrate with the reactive species.

The hollow substrates may be defined broadly as nonconductive and having an ID $\leq 2$ mm. Preferred substrates are microporous, having pores ranging in diameter from 0.001 to 0.2 micron. Such porous substrates may be prepared from inorganic materials or from organic polymers. Preferred classes of polymers include polysulfones, such as polysulfone and polyethersulfone; polyolefins, such as polyethylene and polypropylene; polyamides, such as Nylon 6,6 and Nylon 6,10; polyimides, such as Ultem™ (1000, 5000 and 6000) and Vespel™; fluoropolymers, such as polytetrafluoroethylene and polyvinylidenefluoride; and cellulosic polymers, such as regenerated cellulose, cellulose acetate, and cellulose triacetate. Preferred classes of inorganic materials include carbon; glass, such as Vycor™, borosilicate glass, and other silicate glass compositions; and ceramics, such as those ceramic compositions prepared in mixtures, or in single components, from alumina, zirconia, silicon carbide, and silica.

For fluid separation applications, composite hollow fiber membranes that have previously been internally coated with a permselective coating are preferred. A particularly preferred class of permselective coatings comprises polysiloxane-polyamide copolymers. Such perm selective coatings are preferably prepared by known interfacial polymerization techniques, which allow deposition of thin layers on the lumen surface of hollow fibers.

The plasma generation zone of the reactor is preferably substantially tubular and made of either glass or plastic. A preferred glass is borosilicate. Preferred plastics are polyvinyl chloride, chlorinated polyvinyl chlorides, polysulfone and polycarbonate. The reactor is to be sized in relation to the hollow substrate or bundle of substrates so as to prevent formation of a plasma in the interstitial space between the reactor wall and the outside wall of the substrate or in the interstitial spaces between the outside substrate walls in a bundle of substrates. This is accomplished in the case of a single substrate by requiring the ID of the reactor to be such that the distance between the outer wall of the substrate and the inner wall of the reactor is equal to or less than one-half the internal diameter of the substrate. In the case of multiple substrates, this means that there is to be no interstitial space between the substrates, or between the substrates and the reactor wall, capable of containing an axially positioned cylinder with an outside diameter greater than one-half the ID of the smallest diameter substrate. For example, in the case of a single substrate having an ID of 1.2 and an OD of 1.4 mm, when the substrate is centered in the tubular reactor the ID of the reactor would be less than or equal to [1.2/2+ 1.2/2+1.4], or 2.6 mm. In the case of multiple substrates in the form of a bundle of the same-sized fibers, the ID of the tubular reactor is ideally such that there is no space between the bundle and the inside of the reactor wall and no interstitial space between the fibers in the bundle capable of containing an axially positioned cylinder with an outside diameter that is greater than 0.6 mm. Within these constraints, preferred wall thicknesses for the tubular plasma portion of the reactor are $\leq 3$ mm for glass and $\leq 5$ mm for plastic.

The substrate is positioned in the reactor in general axial alignment therewith and gaseous reactive species is introduced into the lumens of the substrate. If desired, to assist in axial alignment, the substrate may be placed inside another generally elongate nonconductive hollow article, such as a tube or fiber having a larger ID, the larger diameter tube or fiber then being placed in the tubular plasma zone of the reactor. The rate of introduction of gaseous reactive species is generally from about 0.1 to about 50.0 sccm/min and at a pressure of from about 200 to 5000 millitorr. Preferred parameters are a reactive species flow rate of 1 to 10 sccm/min and pressure of 600 to 1900 millitorr. Generally, the pressure of the reactive species must be increased to increase the rate of collision between electrons and reactive species relative to the increasing rate of collision of electrons with the substrate as the diameter of the substrate decreases. It has been discovered that, in order to sustain a plasma in small diameter substrates, the reactive species pressure must be such that there exists a second power of ten functional relationship between the pressure and decreasing substrate inside diameter.

In general, the reactive species may be any monomeric form of gas or gas mixture that is capable of transformation into a polymerizable form upon being subjected to an electrical potential. Preferred classes of monomers include organosilanes, such as vinyltrimethylsilane, trimethylsilyl propyne, and dimethylvinylchlorosilane; organosiloxanes, such as 1-trimethylsiloxy- 1,3-butadiene, hexamethyldisiloxane, hexamethylcyclotrisiloxane, and 1,3-divinyltetramethyldisiloxane; unsaturated organic compounds, such as 1,3 butadiene, tetrafluorobenzene, allylbenzene, propargyl alcohol, 1,3-hexafluorobutadiene, 3,3,4,4-tetrafluorohexa-1,5-diene, and 1-(trifluoromethyl)vinylacetate; and saturated compounds, such as methane, propane and carbon tetrafluoride.

For plasma-induced surface modification, the reactive species may be a single component or mixture of any gas that is polymerizable or non-polymerizable. Preferred classes of non-polymerizable gases include inert gases such as helium, neon, argon, krypton, and xenon; reactive gases such as hydrogen, nitrogen, oxygen, fluorine, chlorine, and bromine; and non-polymerizable vapors of compounds such as water, ammonia, hydrogen fluoride, hydrogen chloride, hydrogen bromide, carbon dioxide, nitrogen oxides, and sulfur dioxide.

Plasma-induced surface treatment or polymerization to modify or coat the inside of the hollow substrate is accomplished by subjecting the reactive species to an RF discharge of from 10 to 500 watts, preferably 50 to 150 watts. Generally, the required power to sustain a plasma increases exponentially with decreasing substrate diameter. This is so because of the energy loss due to the collision of electrons with the substrate. The energy loss and collision rate of electrons with the substrate increase rapidly with decreasing substrate diameter. In addition, the higher required pressure of the reactive species at smaller substrate diameters results in a shorter mean free path of the electrons before collision with a reactive species atom or molecule. Increasing power is therefore also required to increase the acceleration of the electrons so that they have sufficient energy to excite the reactive species upon collision. The power required to sustain a plasma was observed to be proportional to the reciprocal of the substrate diameter raised to the second power. The frequency range of the RF power source is from 0.1 to 100 MHz, and most preferably 13.56 MHz, which is readily commercially available. The required plasma energy density within the reactor should be $>0.5$ watts/mm$^3$, and increases greatly with decreasing substrate diameter; it was observed that the energy density required to sustain a plasma was directly proportional to the reciprocal of the substrate diameter raised to the fourth power.

Exceptionally good and consistent results have been obtained by surrounding the reactor with a magnetic field. This was accomplished by the use of an annular magnet as described in the drawings and Examples. The magnetic field from the surrounding magnet effectively increases the mean free path of electrons in the plasma by orienting them in the Y direction along the axis of the hollow substrate. Such orientation occurs due to an exertion of magnetic flux force upon electrons headed toward the substrate wall, i.e., the flux force derives from the moving charged particle crossing a line of magnetic flux. The strength of the surrounding magnetic field should be from 1,000 to 50,000 gauss. The preferred magnetic field strength is 10,000 gauss, but fields of lesser strength, say 1000 to 1500 gauss, are adequate if costs are a consideration (a 10,000 gauss annular magnet is fairly expensive). By increasing the mean free path of electrons in the Y direction using an annular magnet, the constraints of pressure, power and energy density mentioned above are lessened.

Referring to the drawings, wherein like numerals refer to the same elements, there is shown in FIG. 1 a hollow substrate 1 within a section of a transparent tubular reactor 10. Gaseous reactive species 2 is fed into the reactor 10 and the lumens of hollow substrate 1 by means of high pressure tubing and a needle valve (not shown). A moving plasma zone 3, indicated by dashed lines, is established within the lumens of the hollow substrate 1 by application of an RF discharge from ring electrodes 4g (ground) and 4h ("hot"), the leads 5g and 5h of which are secured to a variable-speed motor-driven track adjacent reactor 10. In a preferred mode of operation, upon application of RF power, ring electrodes 4g and 4h move in a direction opposite to that of the reactive species feed, indicated by the arrow in the lower portion of FIG. 1. Initially, ring electrodes 4g and 4h will be in a position to the left of hollow substrate 1, as shown in phantom in FIG. 1. Upon application of voltage, a plasma zone is established between the electrodes 4g and 4h and within the lumens of hollow substrate 1. As a result, a plasma-induced surface modification or polymerized coating 1c is formed in the lumens of hollow substrate 1.

The rate of movement of electrodes 4g and 4h, and consequently, of the plasma zone established therebetween, may be from 0.1 to 25.0 cm/sec, and preferably from 0.2 to 15.0 cm/sec. As will be appreciated, the same effect may be achieved by allowing the electrodes to remain stationary while moving the hollow substrate, so long as the rate of relative movement between the substrate and electrodes is within the parameters noted.

Ring electrodes 4g and 4h are preferably dimensioned so as to have a width less than or equal to 3 times the OD of the tubular reactor, and an ID greater than the OD of the reactor, but less than 3 times the reactor's OD. Preferred spacing of the ring electrodes 4g and 4h is such that the distance between them is equal to or greater than the OD of the reactor, but less than 5 times the reactor's OD.

Figure 2:
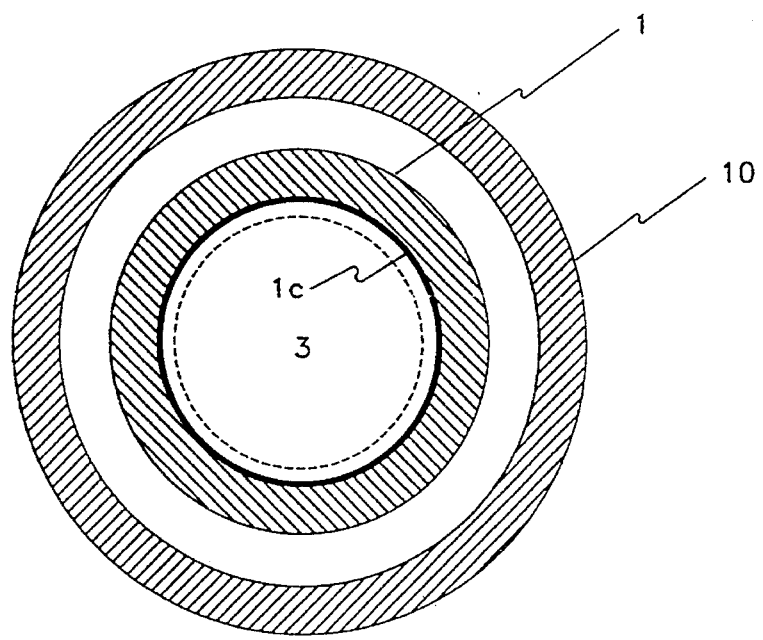
FIG. 2 is a cross-sectional schematic of a hollow substrate in the apparatus of FIG. 1.

FIG. 2 is a sectional taken through the plane 2'—2' of FIG. 1, showing tubular reactor 10, with hollow substrate 1 inside reactor 10, the substrate 1 having therein the plasma zone 3 shown encompassed by dashed lines, and plasma-induced surface modification or polymerized coating 1c on the interior wall thereof.

Figure 3:
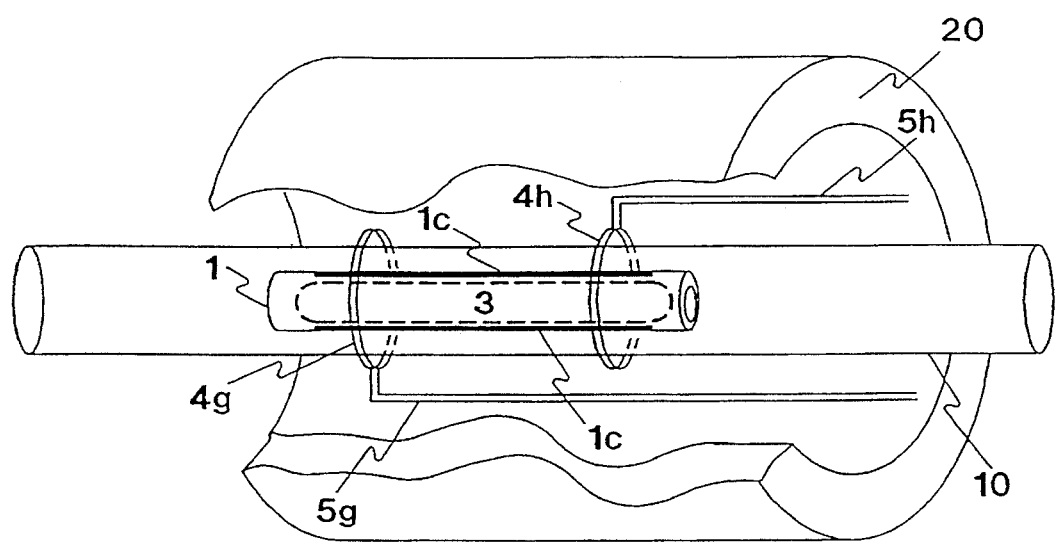
FIG. 3 is a schematic of the apparatus of FIG. 1 used in conjunction with an annular magnet.

FIG. 3 shows the same exemplary reactor of FIG. 1 within an annular magnet 20, a portion of the magnet 20 having been cut away to show the alignment of the axes of the reactor and of the substrate within the annulus of the magnet.

Figure 4:
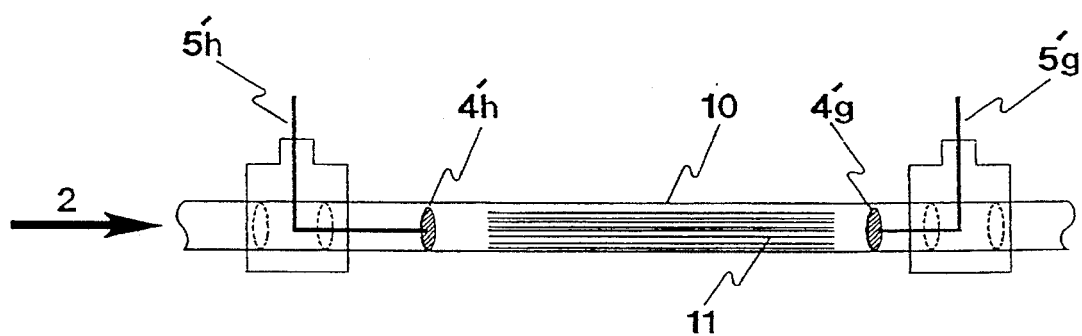
FIG. 4 is a schematic of another exemplary apparatus useful in conducting the process of the present invention.

FIG. 4 depicts another exemplary apparatus useful in carrying out the present invention, where there are shown stationary electrodes 4'g and 4'h connected to a power source (not shown) via leads 5'g and 5'h, the electrodes situated inside tubular reactor 10 containing a bundle of hollow substrates 11, the electrodes being inside of the reactor at opposite ends of the bundle of substrates 11. Such internal electrodes are of solid or porous or mesh conductive metal such as copper or steel and are preferably disc-shaped. The preferred diameter of the discs is greater than 0.75 times the diameter of the bundle of hollow substrates. Such electrodes are preferably located at a distance from the ends of bundle 11 that is greater than 0.25 times, but less than 3 times the diameter of bundle 11.

EXAMPLE 1

A hollow fiber gas separation membrane was prepared by coating the inside surface or lumens of a 150 mm length of a microporous composite PES hollow fiber with a continuous plasma polymer coating. The PES hollow fiber had pores ranging in diameter from 0.05 to 0.1 micron, an inside diameter (ID) of 0.8 mm, and an outside diameter (OD) of 1.1 mm. The interior surface of this hollow fiber was coated with a polysiloxane-polyamide (DISAC) copolymer using the interfacial polycondensation technique set forth in U.S. Pat. No. 4,781,733. This internally-coated fiber was then placed in the lumen of a larger hollow fiber with 1.2 mm ID, 1.4 mm OD and 150 mm long, the larger fiber acting as a sheath for axially orienting the DISAC-coated PES fiber within a tubular reactor of substantially the same configuration as shown in FIG. 1. The tubular reactor had a plasma zone enclosed by a borosilicate glass tube with an ID of 1.8 mm and an OD of 2.2 mm. Monomeric vinyltrimethylsilane (VTMS) vapor was admitted through the reactive species inlet at 5.0 sccm/min and 1,800 millitorr pressure. Copper ring electrodes, the ring band width of which was 6 mm, were spaced 1 cm apart. These electrodes were secured to a motor-driven track adjacent to the glass tube reactor. The initial position of the electrodes was downstream of the VTMS inlet. A plasma zone was established in the reactor tube, in an area beyond the length of hollow fiber contained in the tube, by applying RF power at 150 watts through the electrodes from a 13.56 MHz power source. The electrodes (and consequently the plasma zone) were then passed over the area of the glass tube containing the hollow fiber at a rate of 1 cm/sec. A second electrode/plasma pass was made over the hollow fiber substrate by reversing the direction of the electrodes after the first complete pass over the fiber. A uniform poly(vinyltrimethylsilane) coating approximately 0.4 micron in thickness was deposited on the lumen surface of the PES hollow fiber substrate. The so-coated composite fiber was removed from the reactor and tested for its capability to separate oxygen from nitrogen, and proved to have an oxygen-to-nitrogen separation factor of 7.8 and an oxygen flux of 0.032 $Nm^3/m^2 \cdot hr \cdot atm$.

EXAMPLE 2

Example 1 was substantially repeated with the exception that the monomer was subjected to a surrounding magnetic field the flux lines of which were substantially parallel to the longitudinal axis of the hollow fiber substrate. A coaxial annular magnet was positioned to surround the plasma zone of the reactor so that the tubular reactor and external electrodes passed through the center of the annulus of the magnet. The magnet had a magnetic field strength of 1,500 gauss measured in air. The monomer feed was at 5.0 sccm/min and 1,200 millitorr. The RF power was 100 watts. The plasma polymerized coating produced on the lumen surface of the hollow fiber substrate was 0.4 micron in thickness.

EXAMPLE 3

Example 1 was substantially repeated with the exceptions noted. The DISAC-coated PES hollow fiber had pores ranging in diameter from 0.02 to 0.04 micron, 1.2 mm ID, and 1.4 mm OD. A 150 mm length of this hollow fiber was placed in the reactor without the hollow fiber sheath described in Example 1. The monomer feed was at 6.0 sccm/min and 1,200 millitorr. RF power was set at 100 watts. The plasma polymerized coating on the lumen surface was 0.4 micron in thickness.

EXAMPLE 4

Example 2 was repeated with the exceptions that the monomer feed was at 6.0 sccm/min and the RF power was set at 50 watts. A 0.4 micron-thick coating on the lumen surface of the fiber was obtained.

EXAMPLE 5

Example 3 was substantially repeated with the exceptions noted. The hollow fiber was 100 mm of non-coated PES having pores ranging in diameter from 0.2 to 0.4 micron. Monomer feed was at 0.95 sccm/min and 1900 millitorr. RF power was set at 150 watts and electrode speed at 0.5 cm/sec. The plasma polymer coating was 0.7 micron, and the so-coated hollow fiber membrane exhibited an oxygen-to-nitrogen separation factor of 3.0, with an oxygen flux of 0.12 $Nm^3/m^2 \cdot hr \cdot atm$.

EXAMPLE 6

Example 5 was repeated with the exceptions that the monomer feed was at 6.7 sccm/min and 1800 millitorr. RF power was set at 100 watts and electrode speed at 1.0 cm/sec. The coating obtained was 0.4 micron thick. The oxygen-to-nitrogen separation factor of the composite membrane was 2.3, with an oxygen flux of 3.8 $Nm^3/m^2 \cdot hr \cdot atm$.

EXAMPLE 7

Example 3 was repeated with the exceptions noted. The reactive species was monomeric tetrafluorobenzene (TFB) fed at 5.0 sccm/min and 1800 millitorr. RF power was set at 1800 watts and electrode speed at 15.0 cm/sec. A coating of poly(tetrafluorobenzene) 0.2 micron thick on the lumen surface of the fiber was obtained.

EXAMPLE 8

Example 4 was substantially repeated with the exceptions noted. A monomer feed comprising a mixture of TFB and VTMS vapor was fed through the monomer inlet at a flow rate of 2.5 sccm/min and a partial pressure of 900 millitorr for each monomer. RF power was set at 100 watts and electrode speed at 5.0 cm/sec. The coating obtained was 0.5 micron thick.

EXAMPLE 9

Example 8 was repeated with the exceptions noted. Reactive species feed was monomeric 1-trimethyl-siloxy- 1,3 butadiene (TMSB) vapor at 7.0 sccm/min and 210 millitorr. RF power was set at 75 watts and electrode speed at 1.0 cm/sec. Only one electrode pass was made over the hollow fiber. The coating obtained was 1.1 micron thick.

EXAMPLE 10

The lumen surface of a hollow substrate was coated without the use of a reactor. Specifically, a continuous plasma polymer coating approximately 1 micron thick was made on the inside surface of a 1.8 mm ID and 2.2 mm OD nonporous glass tube with a VTMS vapor feed at 1.8 sccm/min and 600 millitorr. The same equipment used in prior Examples was used, with RF power set at 30 watts and electrode speed at 0.25 cm/sec. One electrode pass was made.

EXAMPLE 11

Example 10 was repeated with the same result, with the exceptions that the RF power was set at 15 watts and the same annular magnet used in previous Examples was used, with the power set at 1200 gauss.

EXAMPLE 12

Example 4 was substantially repeated with the exceptions noted. The hollow fiber was PES having pores ranging in diameter from 0.05 to 0.1 micron, an ID of 0.6 mm, and an OD of 0.8 mm. An 80 mm length of this fiber was then placed in the plasma zone of the tubular reactor, which was surrounded by a coaxial annular magnet of the type used in previous Examples, set at 1500 gauss. The reactor had an ID of 0.95 mm and an OD of 1.95 mm. The reactive species comprised monomeric VTMS vapor at 5.0 sccm/min and 1,800 millitorr. RF power was set at 150 watts and electrode speed at 1.0 cm/sec. One electrode pass was made over the hollow fiber. The coating obtained was 0.8 micron thick.

Examples 1–12 are summarized in Table 1.

EXAMPLE 13

A plasma polymer coating was formed simultaneously on the lumen surface of multiple hollow fibers having an ID of 1.2 mm using a high voltage discharge. Twelve microporous hollow fibers of the type described in Example 4 were placed as a tightly packed bundle such that there was no interstitial space between fibers in the bundle or between the outside of the bundle and the inside of the reactor that was capable of containing an axially positioned cylinder with an outside diameter of greater than 0.6 mm. The bundle of fibers was 150 mm long in a tubular reactor of substantially the same configuration shown in FIG. 4. This reactor had a plasma zone enclosed by a borosilicate glass tube having an ID of 6.5 mm and an OD of 9.5 mm. Monomeric VTMS vapor was fed to the inside of the fibers at 5.0 sccm/min and 1200 to 1400 millitorr pressure. Internal disc electrodes approximately 5 mm in diameter were placed 5 mm from each end of the fiber bundle. A plasma was established in the ends of the reactor tube and in the lumen of each of the hollow fibers by applying a high voltage Tesla coil power source to the electrode on the VTMS inlet side of the hollow fiber bundle. The Tesla coil had an output voltage in the range of 25,000 to 50,000 volts at a frequency of approximately 0.1 to 10 MHz, approximating an RF power of 50 watts. The plasma was applied for a period of one minute to produce an average plasma polymer coating thickness of 4 microns.

EXAMPLE 14

The lumen surface properties of DISAC-coated PES fibers were modified by a non-polymerizable gas plasma treatment as follows. Example 3 was substantially repeated with the exceptions noted. The reactive species was argon gas at a flow rate of 4.9 sccm/min and 1,800 millitorr pressure. RF power was set at 75 watts. A single electrode sweep was made at the rate of 1 cm/sec. The lumen surface of the DISAC-coated fiber was thus contacted with a non-polymerizable argon plasma. The so-surface-modified composite fiber was removed from the reactor and tested for its capability to separate oxygen from nitrogen, and proved to have an oxygen-to-nitrogen separation factor of 1.1 and an oxygen flux of 0.017 $Nm^3/m^2 1,1 \cdot hr \cdot atm$. Prior to argon plasma surface modification, the composite fiber had an oxygen-to-nitrogen separation factor of 2.6 and an oxygen flux of 0.11 Nm³/m²·hr·atm. Modification of the surface properties of the DISAC coating was thus confirmed by the simultaneous decrease in the oxygen-to-nitrogen separation factor and the oxygen flux.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

TABLE 1

| | Fiber | | | Coating | | | | Electrode | | Magnet |
|---|---|---|---|---|---|---|---|---|---|---|
| Ex. No. | Type | ID (mm) | OD (mm) | Thickness (micron) | Monomer Type | Flow* | Pressure** | Power (watts) | Speed (cm/sec) | Power (gauss) |
| 1 | DISAC | 0.8 | 1.1 | ~0.4 | VTMS | 5.0 | 1800 | 150 | 1.0 | — |
| 2 | DISAC | 0.8 | 1.1 | 0.4 | VTMS | 5.0 | 1200 | 100 | 1.0 | 1500 |
| 3 | DISAC | 1.2 | 1.4 | 0.4 | VTMS | 6.0 | 1200 | 100 | 1.0 | — |
| 4 | DISAC | 1.2 | 1.4 | 0.4 | VTMS | 6.0 | 1200 | 50 | 1.0 | 1500 |
| 5 | PES | 1.2 | 1.4 | 0.7 | VTMS | 0.95 | 1900 | 150 | 0.5 | — |
| 6 | PES | 1.2 | 1.4 | 0.4 | VTMS | 6.7 | 1800 | 100 | 1.0 | — |
| 7 | DISAC | 1.2 | 1.4 | 0.2 | TFB | 5.0 | 1800 | 100 | 15.0 | — |
| 8 | DISAC | 1.2 | 1.4 | 0.5 | VTMS/TFB | 2.5 | 900/900 | 100 | 5.0 | 1500 |
| 9 | DISAC | 1.2 | 1.4 | 1.1 | TMSB | 7.0 | 210 | 75 | 1.0 | 1500 |
| 10 | glass | 1.8 | 2.2 | 1.0 | VTMS | 1.8 | 600 | 30 | 0.25 | — |
| 11 | glass | 1.8 | 2.2 | 1.0 | VTMS | 1.8 | 600 | 15 | 0.25 | 1200 |
| 12 | PES | 0.6 | 0.8 | 0.8 | VTMS | 5.0 | 1800 | 150 | 1.0 | 1500 |

*sccm/min
**millitorr

What is claimed is:

1. A fluid separation membrane comprising a microporous hollow fiber substrate having a first lumen-side coating that is permselective and a second lumen-side coating that is formed by plasma polymerization.

2. The membrane of claim 1 wherein said hollow fiber substrate has pores of from about 0.01 to about 0.2 µm in diameter.

3. The membrane of claim 1 wherein said hollow fiber substrate is a polymer selected from the group consisting of polysulfones, polyolefins, polyimides, chlorinated polymers, fluoro polymers and cellulosic polymers.

4. The membrane of claim 1 wherein said hollow fiber substrate is an inorganic material selected from the group consisting of carbon, glass, alumina, zirconia, silicon carbide and silica.

5. The membrane of claim 1 wherein said first lumen-side coating is formed by interfacial polymerization.

6. The membrane of claim 5 wherein said first lumen-side coating comprises polysiloxane-polyamide copolymers.

7. The membrane of claim 1 wherein said second lumen-side coating is formed from a reactive species selected from the group consisting of organosilanes, organosiloxanes, saturated and unsaturated organic compounds, inert gases, and non-polymerizable gases.

* * * * *

UNITED STATES PATENT AND TRADEMARK OFFICE
CERTIFICATE OF CORRECTION

PATENT NO. : 5,514,276

DATED : May 7, 1996

INVENTOR(S) : Babcock, Johnson, Rayfield and Hyde

It is certified that error appears in the above-indentified patent and that said Letters Patent is hereby corrected as shown below:

Col. 3, line 59: delete "$[1.^2/2+1.^2/2+1.4]$
      insert -- $[1.2/2 + 1.2/2 + 1.4]$ --.

Signed and Sealed this

Third Day of December, 1996

Attest:

BRUCE LEHMAN

Attesting Officer     Commissioner of Patents and Trademarks